(12) United States Patent
Tani et al.

(10) Patent No.: US 8,356,401 B2
(45) Date of Patent: Jan. 22, 2013

(54) ELECTRICAL CABLE WIRING HEAD DEVICE AND ELECTRICAL CABLE WIRING APPARATUS

(75) Inventors: Noriyuki Tani, Yokkaichi (JP); Akinori Ooishi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 361 days.

(21) Appl. No.: 12/842,428

(22) Filed: Jul. 23, 2010

(65) Prior Publication Data

US 2011/0030202 A1 Feb. 10, 2011

(30) Foreign Application Priority Data

Aug. 5, 2009 (JP) .................................. 2009-182386

(51) Int. Cl.
*B23P 19/00* (2006.01)
(52) U.S. Cl. ............... 29/745; 29/33 F; 29/739; 29/748; 29/759
(58) Field of Classification Search .................... 29/745, 29/738, 739, 748, 759, 33 F, 825, 829, 846, 29/850; 156/155, 158, 272.8, 361, 380.7, 156/433
See application file for complete search history.

(56) References Cited

U.S. PATENT DOCUMENTS 4,693,778 A * 9/1987 Swiggett et al. ............... 156/361
5,259,051 A * 11/1993 Burack et al. .................... 385/76

FOREIGN PATENT DOCUMENTS

| JP | A-10-224951 | 8/1998 |
| JP | A-2007-53847 | 3/2007 |
| JP | A-2007-53848 | 3/2007 |
| JP | A-2007-214035 | 8/2007 |

* cited by examiner

*Primary Examiner* — Thiem Phan
(74) *Attorney, Agent, or Firm* — Oliff & Berridge, PLC

(57) ABSTRACT

An electrical cable wiring head apparatus is provided to rapidly wire an electrical cable while more effectively restraining the electrical cable from floating. An electrical cable wiring head device of the electrical cable wiring head apparatus moves along a wiring surface of a wiring plate to wire an electrical cable on the wiring surface. The electrical cable wiring head device comprises: a head section supported rotatably about a rotary axis and provided with a guide recess for leading the electrical cable to the wiring surface, the guide recess being offset from the rotary axis; a head rotating mechanism for rotating the head section; a guide pushing member including a shaft portion and a roller portion provided rotatably on a distal end of the shaft portion, the guide pushing member being supported movably along the rotary axis; and a guide pushing member drive mechanism for reciprocating the guide pushing member.

8 Claims, 6 Drawing Sheets

ELECTRICAL CABLE WIRING HEAD DEVICE AND ELECTRICAL CABLE WIRING APPARATUS

CROSS-REFERENCE TO RELATED APPLICATION

This application claims priority to JP2009-182386 filed in Japan on Aug. 5, 2009, the disclosure of which is hereby incorporated by reference in its entirety.

BACKGROUND

This invention relates to a technique for producing an electrical circuit component provided with a wired electrical cable, such as an electrical junction box or the like to be used as motor vehicle parts.

Electrical cable wiring apparatuses have been known in the art. For example, JP-A-10-224951 discloses an electrical cable wiring apparatus in which a head section for supplying a coated electrical cable is rotatably supported and a pushing pin and a third guide roller are incorporated with the head section. The third guide roller is disposed at a rear side from a rotary axis of the head section in a wiring direction and at a position higher than a bottom surface of the head section. When the head section is moved, the electrical cable is drawn out of the head section while the coated electrical cable is being guided by the third guide roller. The pushing pin is disposed so as to reciprocate on the rotary axis of the head section. When the head section is moved, the pushing pin is retracted. When the head section is stopped at a given bending point, the pushing pin is advanced to press the coated electrical cable onto a wiring plate.

In addition, JP-A-2007-53847 discloses an electrical cable wiring apparatus in which an unrotatable head section is provided with a pin member having a rotatable member. The pin member can move slidably at a position across an electrical cable outlet in an X-axis direction and a Y-axis direction.

However, according to the technique disclosed in JP-A-10-224951, because the third guide roller for guiding the coated electrical cable is disposed at the rear side from the rotary axis of the head section in the wiring direction and at the position higher than the bottom surface of the head section when the head section is moving, there is a problem that the coated electrical cable is floated from the wiring plate significantly. If the coated electrical cable is floated significantly, the pushing pin must be advanced to press the coated electrical cable onto the wiring plate when the head section is stopped at a suitable timing. Consequently, there is a problem that a period in time for wiring will be elongated.

According to the technique disclosed in JP-A-2007-53847, because it is possible to press the coated electrical cable onto the wiring plate only when the head section moves straightly along the X-axis direction or the Y-axis direction, there is a problem that the coated electrical cable is likely to float from the wiring plate at the bending point or the like.

SUMMARY

In view of the above problems, an object of the present invention is to rapidly wire an electrical cable while more effectively preventing the electrical cable from floating.

In order to solve the above problems, a first aspect of the present invention is directed to an electrical cable wiring head device that can move along a wiring surface of an object to be wired to connect an electrical cable to the wiring surface. The electrical cable wiring head device comprises: a head section supported rotatably about a rotary axis of the head section that is substantially perpendicular to the wiring surface and including a guide recess for guiding the electrical cable along a path to the wiring surface, the guide recess being offset from the rotary axis; a head rotating mechanism for rotating the head section about the rotary axis; a guide pushing member including a shaft portion and a roller portion provided rotatably on a distal end of the shaft portion, the guide pushing member being supported movably along the rotary axis so that the roller portion is directed to the wiring surface; and a guide pushing member drive mechanism for reciprocating the guide pushing member so that the roller portion is moved between a first retracted position where the roller portion guides the electrical cable supplied from the head section and a first advanced position where the roller portion presses the electrical cable supplied from the head section onto the wiring surface.

A second aspect of the present invention is directed to an electrical cable wiring head device according to the first aspect. In the second aspect, the first retracted position is a position where the roller portion protrudes from a bottom surface of the head section toward the wiring surface.

A third aspect of the present invention is directed to an electrical cable wiring head device according to the first or second aspect. In the third aspect, the electrical cable wiring head device further comprises: an auxiliary pushing member formed into a bar-like shape and supported movably along a plane that is offset from and parallel to the rotary axis, the rotary axis being located between the auxiliary pushing member and the guide recess; and an auxiliary pushing member drive mechanism that reciprocates an end of the auxiliary pushing member between a second advanced position where the electrical cable supplied from the head section is pressed onto the wiring surface and a second retracted position backed from the second advanced position.

A fourth aspect of the present invention is directed to an electrical cable wiring apparatus. The electrical cable wiring apparatus comprises: an electrical cable wiring head device according to any one of the first to third aspects; an object holding section for holding the object to be wired; a wiring drive mechanism for moving the electrical cable wiring head device along the wiring surface of the object to be wired.

According to the first aspect of the present invention, since the roller portion that guides the electrical cable supplied from the head section is disposed on the rotary axis of the head section, the roller portion of the guide pushing member can guide the electrical cable on the rotary axis of the head section. Thus, even when the head section is rotated about the rotary axis in order to bend and wire the electrical cable, the roller portion of the guide pushing member can guide the electrical cable. Thus, it is possible to effectively restrain the cable from floating from the wiring plate. Consequently, even if the electrical cable is bent and connected to the wiring surface, it is possible to reduce the number of operations of pushing the electrical cable when the head section is stopped, thereby rapidly connecting the electrical cable.

According to the second aspect of the electrical cable wiring head device, since the roller portion can guide the electrical cable near the wiring surface rather than the bottom surface of the head section during wiring the electrical cable, it is possible to surely prevent the electrical cable from floating from the wiring plate.

According to the third aspect of the electrical cable wiring head device, it is possible to press the electrical cable onto the wiring plate even by the auxiliary pushing member.

According to the electrical cable wiring apparatus of the fourth aspect, it is possible to more rapidly connect the electrical cable while the electrical cable is being more effectively restrained from floating from the wiring plate.

PREFERRED ASPECTS OF EMBODYING THE INVENTION

Detailed Description of Embodiments

Figure 1:
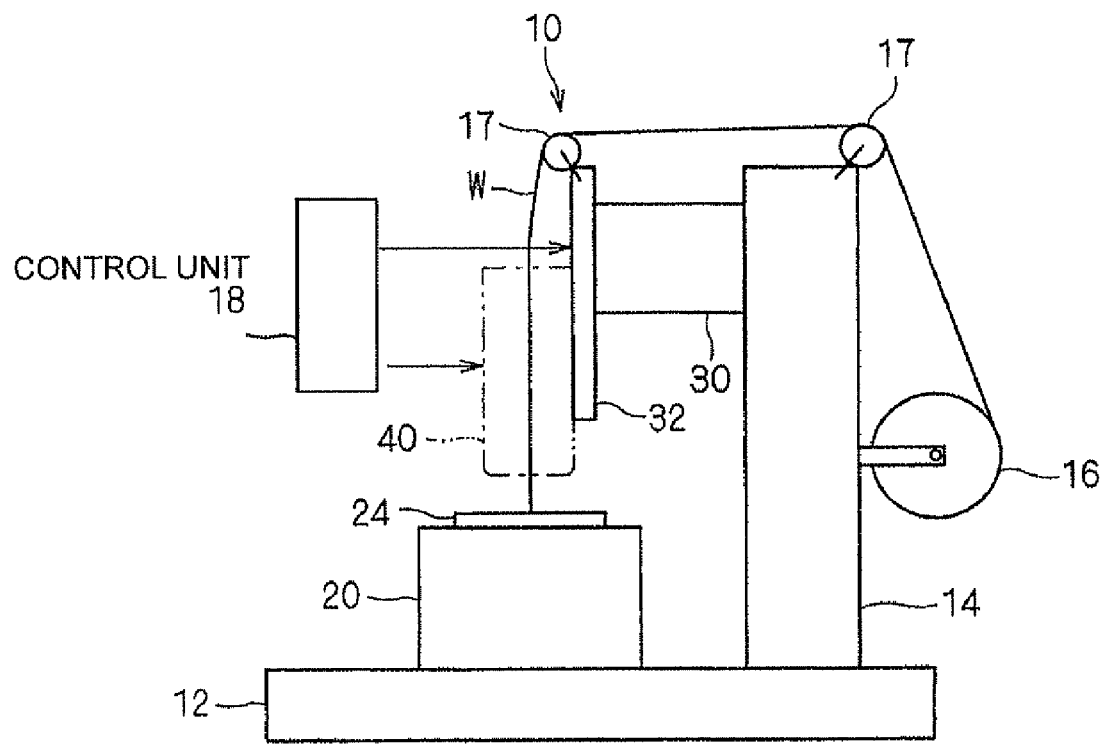
FIG. 1 is an explanatory view of an embodiment of an electrical cable wiring apparatus in accordance with the present invention.
Figure 2:
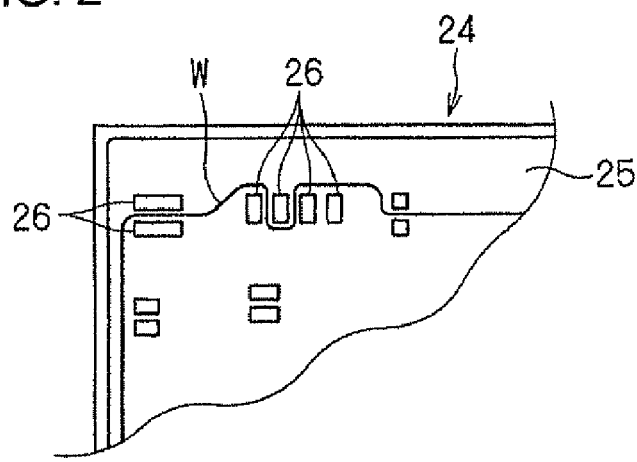
FIG. 2 is a schematic plan view of a part of a wiring plate that is an object to be wired.

Referring now to the drawings, embodiments of an electrical cable wiring head device and an electrical cable wiring apparatus including the head device in accordance with the present invention will be described below. FIG. 1 is an explanatory view illustrating the whole of an electrical cable wiring apparatus 10. FIG. 2 is a schematic plan view illustrating a part of a wiring plate 24 that is an object to be wired.

Firstly, a general whole construction of the electrical cable wiring device 10 will be described below. The electrical cable wiring device 10 includes an electrical cable wiring head device 40, a wiring plate setting section 20, and a wiring drive section 30.

The wiring plate setting section 20 serves as a wiring object holding section that holds the wiring plate 24 (an object to be wired) at a given position and in a given posture. The wiring plate setting section 20 is fixed on a given base table 12. The wiring plate 24 is held on the wiring plate setting section 20 by a fitting structure, a well known locking structure, or the like.

In the present embodiment, the wiring plate 24 is made of resin or the like and includes a flat plate 25 with a wiring surface 25f, and a plurality of projecting portions or ribs 26 (FIG. 2) provided on the wiring surface 25f. The projecting portions 26 are disposed so that the projecting portions 26 can hold an electrical cable W in a given wiring pattern. The electrical cable W can be held in the given wiring pattern by bending the electrical cable W at the projecting portions 26 and by threading the electrical cable W into a space between the projecting portions 26.

The electrical cable W may be wired on the other surface of the wiring plate 24. The wiring plate 24 mounts electrical components (not shown) such as relays, power semiconductor devices, and connecting terminals that are electrically connected to the electrical cable W.

The wiring drive section 30 is overhung from an upper end part of a support post 14 secured to the base table 12. The wiring drive section 30 includes a combination of a servo motor and a ball screw, or a two-axle moving mechanism provided with two linear drive mechanism constructed by linear motors. The electrical cable wiring head device 40 is supported through a head attaching bracket 32 on a distal end of the wiring drive section 30. The wiring drive section 30 moves the electrical cable wiring head device 40 along a plane substantially parallel to the wiring surface 25f of the wiring plate 24 disposed on the wiring plate setting section 20.

Although the wiring plate 24 is stationarily disposed at a given position on the setting section 20 and the electrical cable wiring head device 40 is moved above the wiring plate 24 in the present embodiment, the electrical cable wiring head device 40 may be stationary and the wiring plate 24 may be movable. That is, the wiring drive section 30 can cause a relative motion between the electrical cable wiring head device 40 and the wiring plate 24.

The electrical cable wiring apparatus 10 also includes a supply reel 16 on which the electrical cable W is wound by several turns. In the present embodiment, the supply reel 16 is rotatably supported on a side surface of the support post 14. The electrical cable W is continuously supplied from the supply reel 16 through a guide reel 17 to the electrical cable wiring head device 40.

The electrical cable wiring head device 40 continuously leads the electrical cable W from the supply reel 16 onto the wiring surface 25f while the device 40 is moving along the wiring surface 25f. Consequently, the electrical cable W is wired on the wiring surface 25f in a given wiring pattern.

Figure 3:
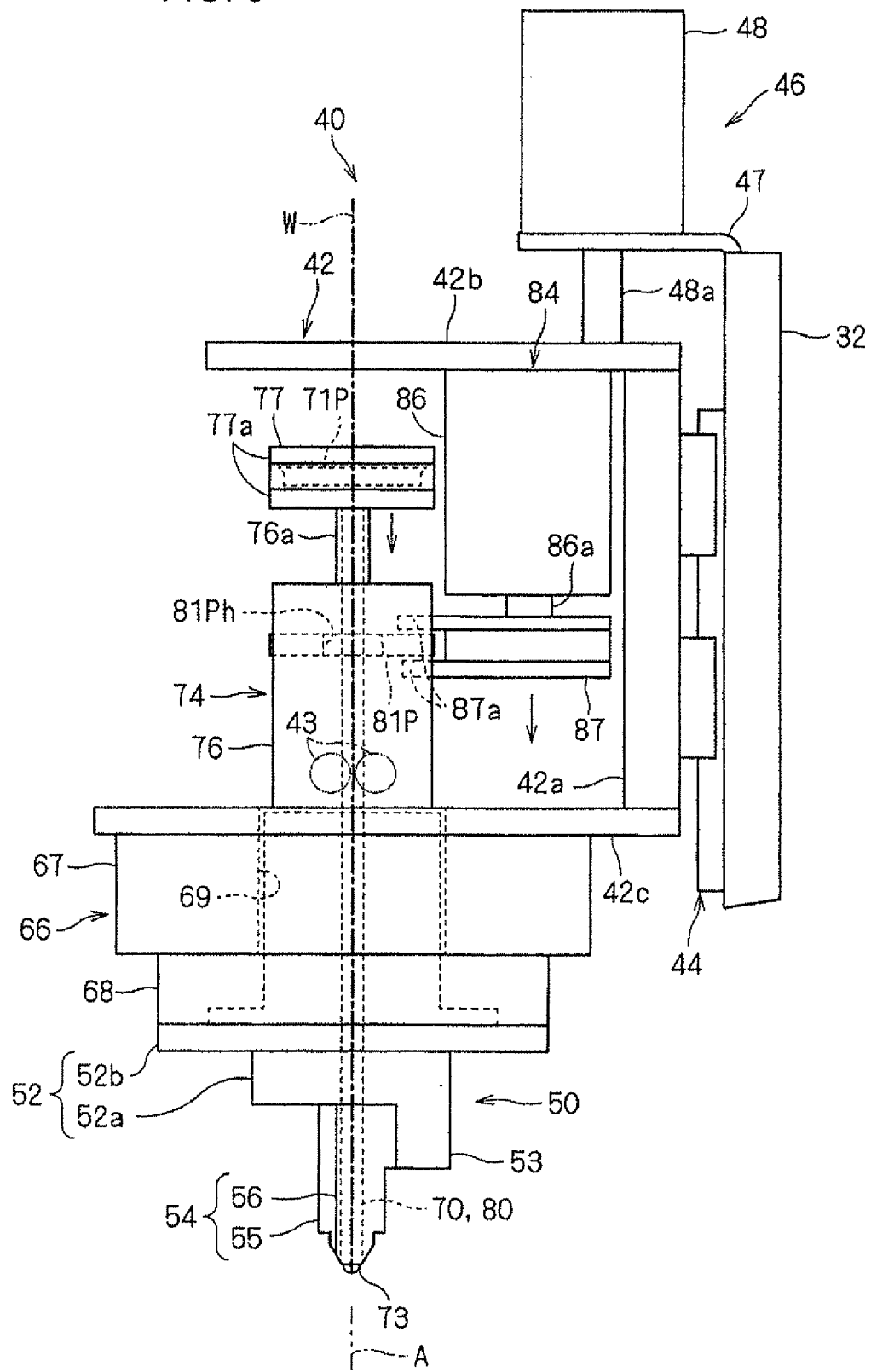
FIG. 3 is a side elevation view of an electrical cable wiring head device.
Figure 4:
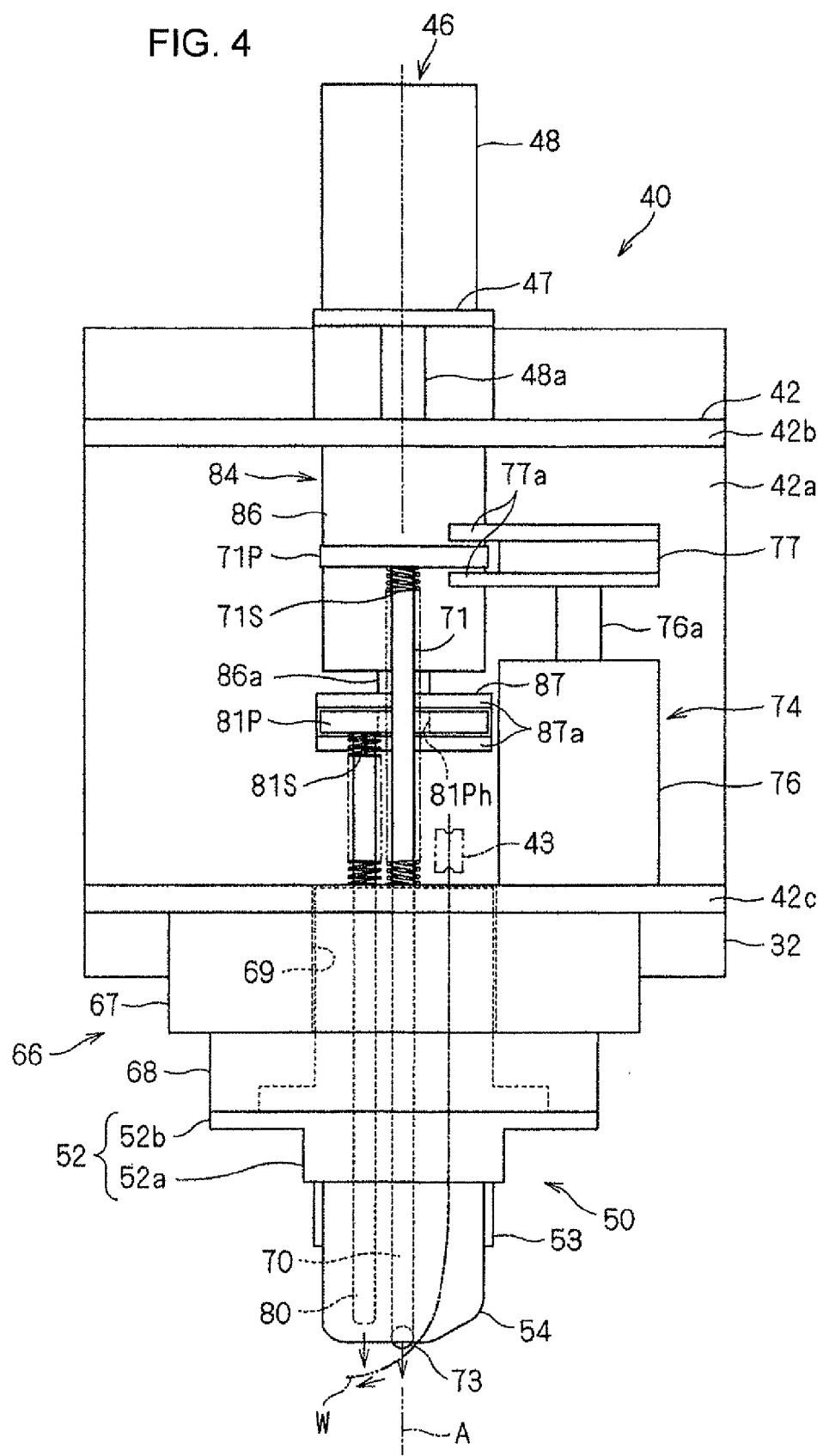
FIG. 4 is a front elevation view of the electrical cable wiring head device.
Figure 5:
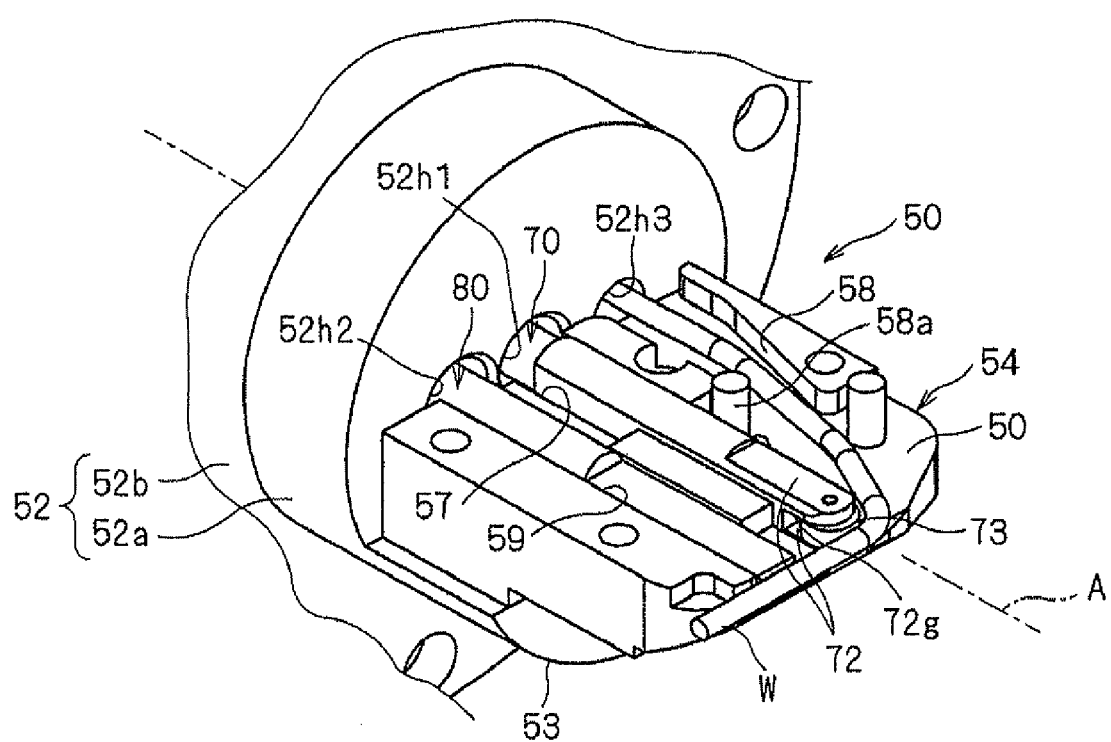
FIG. 5 is a perspective view of a head section of the electrical cable wiring head device.
Figure 6:
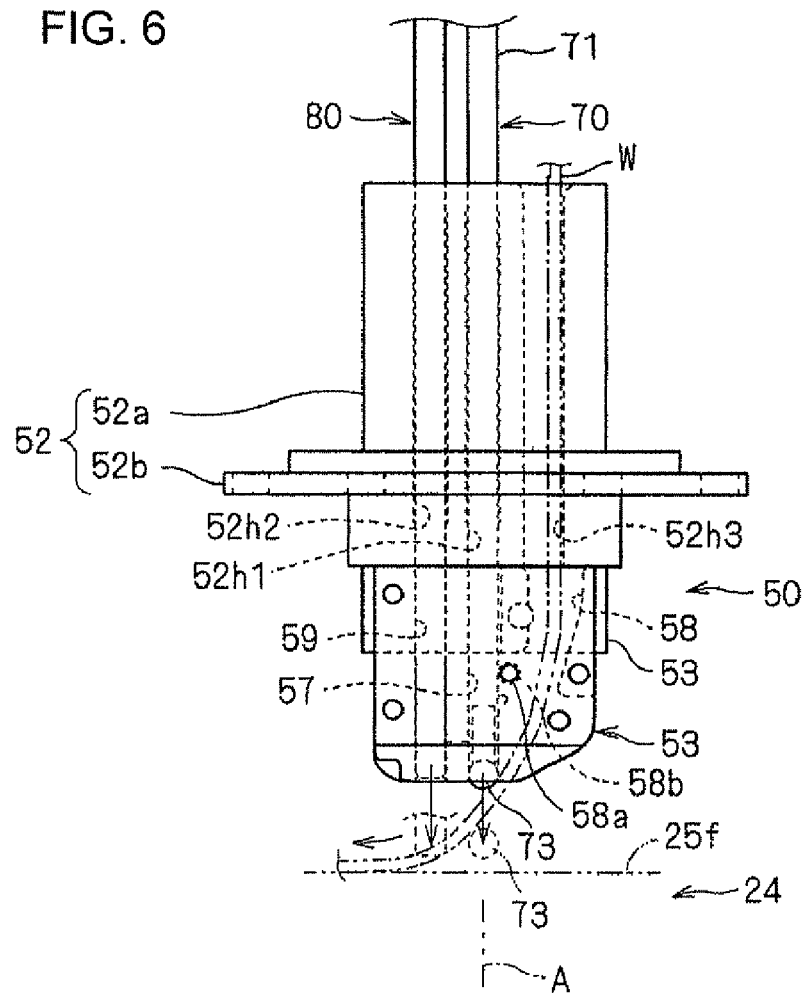
FIG. 6 is a front elevation view of the head section shown in FIG. 5.

The electrical cable wiring head device 40 will be described below in more detail by referring to FIGS. 3 to 6. FIG. 3 is a side elevation view of the electrical cable wiring head device 40. FIG. 4 is a front elevation view of the electrical cable wiring head device 40. FIG. 5 is a perspective view of a head section 50 of the electrical cable wiring head device 40. FIG. 6 is a front elevation view of the head section 50 shown in FIG. 5. FIG. 5 shows a main head body portion 56 from which a sub-head body portion 55 is removed.

The electrical cable wiring head device 40 includes the head portion 50, a head rotating mechanism 66, a guide pushing member 70, and a guide pushing member drive mechanism 74. These elements 50 to 74 are supported directly or indirectly in a head support housing 42.

That is, the head support housing 42 includes a rear side plate 42a, an upper plate 42b, and a lower plate 42c. The plates 42b and 42c are supported on upper and lower ends of the rear side plate 42a so that the plates 42b and 42c are separated away from each other in a vertical direction and are opposed to each other. The head support housing 42 is supported through a linear guide 44 by a head attaching bracket 32 so as to be moved in the vertical direction.

The head support housing 42 is moved up and down by a head elevating drive section 46. That is, an elevating drive member 48 such as an air cylinder or a hydraulic cylinder is provided through a bracket 47 on an upper end of the head attaching bracket 32. The elevating drive member 48 includes a reciprocating rod 48a. A distal end of the reciprocating rod 48a is coupled to the head support housing 42 (here, an upper surface of the upper plate 42b). When the reciprocating rod 48a is reciprocated by the elevating drive section 48, the electrical cable wiring head device 40 including the head support housing 42 is moved up and down. The electrical cable wiring head device 40 is moved up and down as required before and after wiring or upon wiring.

The head rotating drive mechanism 66 is attached to a bottom surface of the lower plate 42c of the head support housing 42. The head rotating drive mechanism 66 forms a rotary actuator (a hollow rotary actuator or a hollow motor) that includes an annular stationary portion 67, an annular rotary portion 68 rotatably mounted in the portion 67, and a hollow space 69 around a rotary axis A of the portion 68. The rotary portion 68 is directed downward and the stationary portion 67 is attached to the bottom surface of the lower plate 42c. However, the head rotating drive mechanism 66 may be constructed so that the head section 50 is rotated through a transmitting member such as gears or a cyclic belt by a motor that is offset from the rotary axis A, as well as the above construction.

The head section 50 is rotatably supported by the head rotating drive mechanism 66 so that the head section 50 can be rotated about the rotary axis A (here, a vertical axis) perpendicular to the wiring surface 25f, thereby leading the electrical cable W onto the wiring surface 25f.

More specifically, the head section 50 includes a head base 52 and a head body 54. The head base 52 includes a cylindrical portion 52a and a flange-like portion 52b. The cylindrical portion 52a is formed into a substantially cylindrical shape that can be disposed in the hollow space 69 in the head rotating drive mechanism 66. The flange-like portion 52b is formed into a substantially ring-like member that extends outward from an upper end outer peripheral portion of the cylindrical portion 52a. When the cylindrical portion 52a is disposed in the hollow space 69 in the stationary portion 67 and the rotary portion 68 of the head rotating drive mechanism 66, the flange-like portion 52b is secured to the stationary portion 67 by bolts. Thus, the head section 50 can be rotated about the rotary axis A by the head rotating drive mechanism 66.

The cylindrical portion 52a is provided on a lower end with a head attaching plate 53 for securing the head body 54 to the cylindrical portion 52a.

The head base 52 is provided with a first through-hole 52h1 extending along the rotary axis A. A second through-hole 52h2 and a third through-hole 52h3 are offset from and extend in a direction parallel to the rotary axis A. The first through-hole 52h1 is located between the second through-hole 52h2 and the third through-hole 52h3 (see FIGS. 5 and 6). A shaft portion 71 of the guide pushing member 70 is slidably inserted into the first through-hole 52h1 along the rotary axis A. An auxiliary pushing member 80 is slidably inserted into the second through-hole 52h2 in a direction parallel the rotary axis A. The electrical cable W is inserted into the third through-hole 52h3. A pair of electrical cable guide rollers 43 are provided above an upper opening in the third through-hole 52h3 in the head base 52 (see FIG. 4). The electrical cable W passes straightly or slanted with respect to the rotary axis A above the head section 50, passes between the pair of electrical cable guide rollers 43 and is led into the third through-hole 52h3.

The head body 54 is secured to the head attaching plate 53 by bolts and can rotate about the rotary axis A. The head body portion 54 includes a guide recess 58 for leading the electrical cable W to the wiring surface 25f. The guide recess 58 is offset from the rotary axis A (see FIG. 5).

More specifically, the head body portion 54 is divided into a head main body part 56 and a head sub-body part 55.

The head main body part 56 is formed into a substantially square plate member and is secured to the head attaching plate 53 at a position on the rotary axis A. A guide pushing member insertion aperture 57 is provided on the head main body part at a position on the rotary axis A. The insertion aperture 57 is straightly communicated with the first through-hole 52h1 so that the guide pushing member 70 can move slidably in the first through-hole 52h1 and the insertion aperture 57. The head main body part 56 is provided on a side surface adjacent the rotary axis A with the guide recess 58. The guide recess 58 is communicated with the third through-hole 52h3 at an upper opening and is formed into a groove-like shape that is slanted to gradually approach the rotary axis A. The electrical cable W supplied via the third through-hole 52h3 passes the guide recess 58 so as to be led toward the rotary axis A. A support pin 58a protrudes from the guide recess 58 at an intermediate position in a longitudinal direction parallel to the rotary axis A (see FIG. 5). A slide roller 58b is rotatably supported by the support pin 58a (see FIG. 6). The slide roller 58b serves to guide the electrical cable W so that the electrical cable W smoothly passes through the guide recess 58. An auxiliary pushing member insertion aperture 59 is provided on a side surface of the head main body portion 56. The insertion aperture 59 is disposed so that the rotary axis A is between the insertion aperture 59 and the guide recess 58. The auxiliary pushing member insertion aperture 59 is substantially straightly communicated with the second through-hole 52h2 so that the auxiliary pushing member 80 can move in the second through-hole 52h2 and the insertion aperture 59.

The head sub-body part 55 is secured to a side surface of the head main body part 56 by a pin-fitting manner or a bolt-fastening manner. Thus, side openings in the guide pushing member insertion aperture 57, the guide recess 58, and the auxiliary pushing member insertion aperture 59 are closed by the head sub-body part 55.

The guide pushing member 70 includes a shaft portion 71 and a roller portion 73. The shaft portion 71 is slidably inserted into the first through-hole 52h1 and the guide pushing member insertion aperture 57 and is formed into a rod-like member that protrudes upward from a lower end of the head body 54 over the head base 52. The shaft portion 71 is provided on a distal end (a lower end) with a pair of roller support plates 72 that are disposed on opposite sides of a groove 72g extending along the rotary axis A. A roller portion 73 is a short cylindrical member that has an axial dimension to be disposed in the groove 72g. When the roller portion 73 is disposed in the groove 72g so that the roller portion 73 protrudes from a distal end of the roller support plates 72, the roller portion 73 is rotatably supported by the roller support plates 72. The roller portion 73 is directed to the wiring surface 25f (here, downward), the guide pushing member 70 is inserted into the first through-hole 52h1 and the guide pushing member insertion aperture 57, and the roller portion 73 is supported on the roller support plates 72 so that the roller portion 73 can slide along the rotary axis A. Thus, the roller portion 73 can be moved between a retracted position (an upper position in FIG. 6) where the electrical cable W supplied from the head portion 50 is led below the head portion 50 and an advanced position (a lower position in FIG. 6) where the electrical cable W supplied from the head portion 50 is pushed onto the wiring surface 25f. The guide pushing member insertion aperture 57 is formed into a substantially square shape in cross section. A part of the shaft portion 71 to be inserted into the guide pushing member insertion aperture 57 is formed into a square shape rod in cross section. Thus, the shaft portion 71 is unrotatably inserted into the guide pushing member insertion aperture 57. The guide pushing member 70 rotates in association with rotation of the head portion 50 about the rotary axis A.

The shaft portion 71 is provided on an upper projecting end (an upper end), which extends upward from the head section 50, with a drive force receiving plate 71P that has a disk-like shape. A center of the drive force receiving plate 71P accords with the rotary axis A and is connected to the shaft portion 71 (see FIG. 4). An elastic member 71S such as a coil spring is disposed and compressed between the drive force receiving plate 71P and the head section 50. The elastic member 71S always urges the guide pushing member 70 upward.

The guide pushing member drive mechanism 74 reciprocates the guide pushing member 70 so that the roller portion 73 moves between the retracted position and the advanced position.

More specifically, the guide pushing member drive mechanism 74 includes a guide pushing member reciprocating drive element 76 such as an air cylinder, or a hydraulic cylinder. In the present embodiment, the guide pushing member reciprocating drive element 76 is secured to an upper surface of the lower plate 42c at a position that is offset from the rotary axis A. The guide pushing member reciprocating drive element 76 includes a rod portion 76a that extends upward and is reciprocated along the rotary axis A. The rod portion 76a is provided on a distal end with a drive force transmitting element 77. The drive force transmitting element 77 is formed into a plate-like member that extends from the distal end of the rod portion 76a to an outer periphery of the drive force receiving plate 71P. The drive force transmitting element 77 is provided on a distal end with a pair of contact pieces 77a that clamps an outer peripheral edge of the drive force receiving plate 71P at the opposite sides of the plate 71P along the rotary axis A. When the outer periphery of the drive force receiving plate 71P of the shaft portion 71 is disposed between the pair of contact pieces 77a, the guide pushing member reciprocating drive element 76 reciprocates the rod portion 76a, and the guide pushing member 70 is reciprocated between the retracted position and the advanced position. Under this condition, the pair of contact pieces 77a of the drive force transmitting element 77 can move in a peripheral direction of the outer periphery of the drive force receiving plate 712. Thus, even if the guide pushing member 70 and the head section 50 are rotating, or in spite of their rotating postures, a drive force of the guide pushing member reciprocating drive element 76 is transmitted to the guide pushing member 70, thereby reciprocating the guide pushing member 70.

It is preferable that the retracted position is set to be a position where a lower end of the roller portion 73 protrudes toward the wiring surface 25f from the bottom surface of the head section 50. Thus, when the electrical cable W supplied from the head section 50 crosses the rotary axis A, the electrical cable W is guided so as to pass a position lower than the bottom surface of the head section 50. The advanced position is a position where the electrical cable W supplied from the head section 50 can be pressed onto the wiring surface 25f where the rotary axis A intersects the wiring surface 25f. The advanced position is determined in accordance with a distance between the head section 50 and the wiring surface 25f.

This electrical cable wiring head device 40 includes the auxiliary pushing member 80 and an auxiliary pushing member drive mechanism 84 for reciprocating the auxiliary pushing member 80.

The auxiliary member 80 has a bar-like shape and is slidably supported in the head section 50 and is positioned so that the rotary axis A is the guide recess 58 and auxiliary member 80.

More specifically, the auxiliary pushing member 80 is slidably inserted into the second through-hole 52h2 and the auxiliary pushing member insertion aperture 59 and has a length enough to protrude upward from a lower end of the head body 54 over the head base 52. In the present embodiment, the auxiliary pushing member 80 is shorter than the guide pushing member 70. Accordingly, an upper end of the auxiliary pushing member 80 is disposed below an upper end of the guide pushing member 70. A distal end of the auxiliary pushing member 80 is formed into a flat shape in a leading direction of the electrical cable W from the head section 50 (that is, a leading direction in which the electrical cable W led from the guide recess 58 intersects the rotary axis A). The distal end of the auxiliary pushing member 80 is directed to the wiring surface 25f (here, downward), the auxiliary pushing member 80 is inserted into the second through-hole 52h2 and the auxiliary pushing member insertion aperture 59, and the auxiliary member 80 is slidably supported along a plane that is offset and parallel to the rotary axis A. Thus, the distal end of the auxiliary pushing member 80 can be moved between an advanced position (a lower side position in FIG. 6) where the member 80 pushes the electrical cable W led from the head section 50 onto the wiring surface 25f and a retracted position (an upper side position in FIG. 6) where the member 80 is moved backward from the advanced position. It is preferable that at least a part of the distal end of the auxiliary pushing member 80 has a size smaller than that of the distal end of the guide pushing member 70. For example, it is preferable that a thickness of the flat part at the distal end of the auxiliary pushing member 80 is smaller than a thickness of the distal end of the guide pushing member 70 in the same direction. Thus, even if there is a narrow space where the guide pushing member 70 cannot push the electrical cable W, the auxiliary pushing member 80 can push the electrical cable W onto the wiring surface 25f.

Since the auxiliary pushing member 80 is supported by the head section 50 at a position that is offset from the rotary axis A, when the head section 50 rotates about the rotary axis A, the auxiliary pushing member 80 rotates on a circle about the rotary axis A in association with rotation of the head section 50.

The auxiliary pushing member 80 is provided on an upper projecting end (an upper end), which extends upward from the head section 50, with the drive force receiving plate 81P that has a disk-like shape. The drive force receiving plate 81P is provided in a center with an aperture 81Ph (see FIG. 4). The guide pushing member 70 protrudes upward through the apertures 81Ph. The auxiliary pushing member 80 is connected to the drive force receiving plate 81P at a location offset from the rotary axis A and within an outer peripheral edge around the drive force receiving plate 81P. When the auxiliary pushing member 80 rotates about the rotary axis A in connection with rotation of the head section 50, the drive force receiving plate 81P rotates about the rotary axis A. The elastic member 81S such as a coil spring is disposed and compressed between the drive force receiving plate 81P and the head section 50. The elastic member 81S always urges the guide pushing member 80 upward.

The auxiliary pushing member drive mechanism 84 reciprocates the auxiliary pushing member 80 so that the distal end of the auxiliary pushing member 80 moves between the retracted position and the advanced position.

More specifically, the auxiliary pushing member drive mechanism 84 includes an auxiliary pushing member reciprocating drive element 86 such as an air cylinder, or a hydraulic cylinder. In the present embodiment, the auxiliary pushing member reciprocating drive element 86 is secured downward to a bottom surface of the upper plate 42b at a location offset from the rotary axis A (at a side of the rear plate portion 42a). The auxiliary pushing member reciprocating drive element 86 includes a rod portion 86a that extends downward and is reciprocated along a plane parallel to and offset from the rotary axis A. The rod portion 86a is provided on a distal end with a drive force transmitting element 87. The drive force transmitting element 87 is formed into a plate-like member that extends from the distal end of the rod portion 86a to an outer periphery of the drive force receiving plate 81P. The drive force transmitting element 87 is provided on a distal end with a pair of contact pieces 87a, as is the case with the drive force transmitting element 77. When the outer periphery of the drive force receiving plate 81P of the auxiliary pushing member 80 is disposed between the pair of contact pieces 87a, the auxiliary pushing member reciprocating drive element 86 reciprocates the rod portion 86a, and the auxiliary pushing member 80 is reciprocated between the retracted position and the advanced position. Under this condition, the pair of contact pieces 87a of the auxiliary pushing member drive force transmitting element 87 can be moved in a peripheral direction of the outer periphery of the drive force receiving plate 81P. Thus, even if the guide pushing member 70 is rotating, or in spite of the rotating posture of the pushing member 70 in association with rotation of the head section 50, a drive force of the auxiliary pushing member reciprocating drive element 86 is transmitted to the auxiliary pushing member 80, thereby reciprocating the auxiliary pushing member 80.

In the present embodiment, the advanced position of the distal end of the auxiliary pushing member 80 a position where the electrical cable W supplied from the head section 50 can be pressed onto the wiring surface 25f where the rotary axis A intersects the wiring surface 25f. The advanced position is determined in accordance with a distance between the head section 50 and the wiring surface 25f. The retracted position is set to be a position backed from the advanced position toward the head section 50. Preferably, the distal end of the auxiliary pushing member 80 is backed toward the head section 50 from the roller portion 73.

The electrical cable wiring head device 40 and the wiring drive section 30 in the electrical wiring apparatus 10 are controlled by a control unit including a general microcomputer provided with a CPU, a ROM, and a RAM.

When the electrical cable wiring apparatus 10 constructed above wires the electrical cable W, the wiring plate 24 is set on the wiring plate setting section 20, and the wiring head device 40 is moved above the wiring plate 24 while the electrical cable W is being supplied. At this time, the head section 50 is rotated by the head rotating mechanism 66 so that the guide recess 58 is disposed at a front side with respect to the rotary axis A in an advancing direction of the wiring head device 40 relative to the wiring plate 24. In other words, the electrical cable W supplied through the guide recess 58 from the head section 50 crosses the rotary axis A, and is wired onto the wiring surface 25f while the electrical cable W is being guided by the roller portion 73. Thus, the electrical cable W is wired on the wiring plate 24 in a given wiring pattern.

Figure 7:
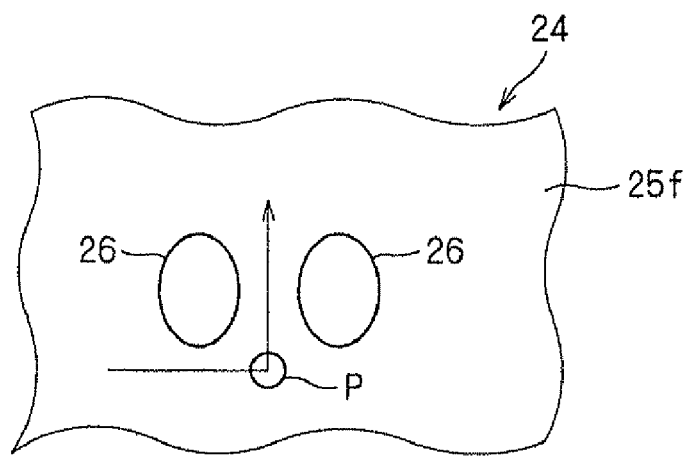
FIG. 7 is an explanatory view of an example of a wiring path.

By referring now to FIG. 7, an operation of wiring the electrical cable W on the wiring plate 24 by bending the electrical cable W around projecting portions 26 provided on the wiring plate 24. More specifically, two projecting portions 26 are provided on the wiring plate 24 to be separated apart from each other. The electrical cable W is bent by an angle of about 90 degrees by a single projecting portion 26 so that the electrical cable W crosses a space between the two projecting portions 26 from a side of the single projecting portion 26. In this case, the head section 50 is rotated at a bending point P by an angle of about 90 degrees on the rotary axis A. During rotation of the head section 50, displacement of the head section 50 along the wiring surface 25f may be continued or stopped.

Figure 8:
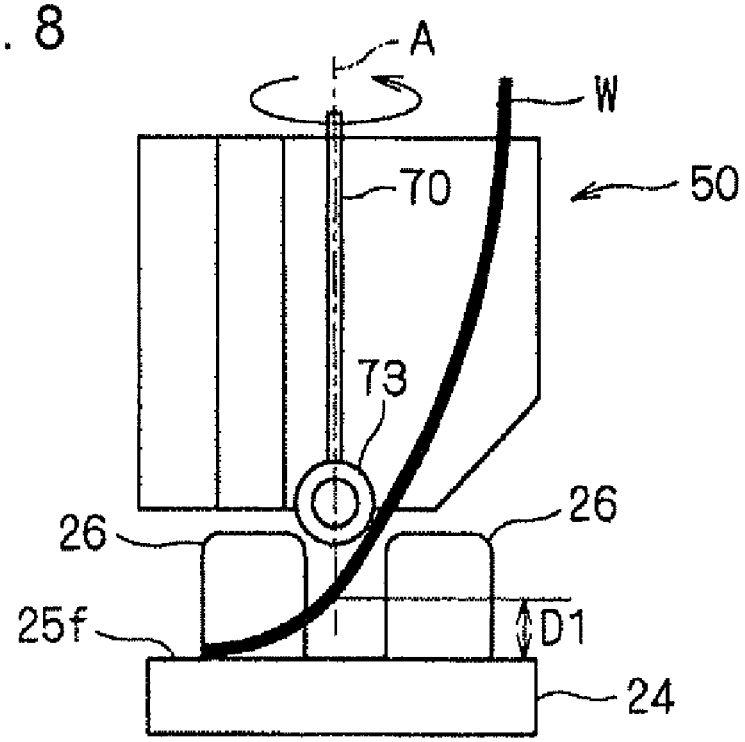
FIG. 8 is an explanatory view of an electrical cable W in a state immediately before rotating.

FIG. 8 is an explanatory view illustrating the electrical cable W immediately before rotating the head section 50. As shown in FIG. 8, a lower end of the roller 73 is disposed below the bottom surface of the head section 50 on the rotary axis A. Accordingly, immediately before rotating the head section 50, the electrical cable W is being guided by the roller portion 73, passes a path lower than the bottom surface of the head section 50 on the rotary axis A, and is led onto the wiring surface 25f on the wiring plate 24. At this time, a floating distance D1 between the electrical cable W and the wiring surface 25f is relatively small. When the head section 50 is rotated about the rotary axis A under this condition, the electrical cable W is restrained from floating with respect to the wiring surface 25f as small as possible and is wired on the wiring surface 25f by catching the electrical cable W by the inner side projecting portion 26. Consequently, it is possible to restrain the electrical cable W from floating as small as possible.

Figure 9:
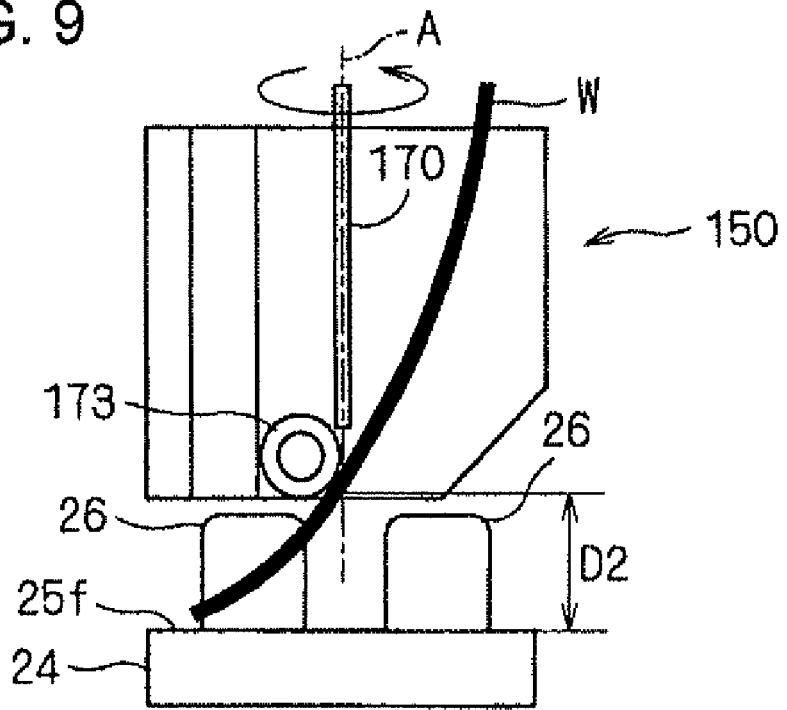
FIG. 9 is an explanatory view illustrating a state of an electrical cable W according to a comparative example.

FIG. 9 shows a comparative example. FIG. 9 shows an electrical cable W in the case where a roller portion 173 is disposed at a rear side offset from a rotary axis A in a moving direction of a head section 150 above a wiring plate 24. In this case, while the head section 150 is moving, the electrical cable W is supplied from the head section 150, and the electrical cable W is merely restrained from floating from a wiring surface 25f at a position offset from the rotary axis A by a certain distance. Consequently, under a condition immediately before rotation of the head section 150, a floating distance D2 from an intersection between the wiring surface 25f and the rotary axis A becomes relatively great (D2>D1). Under this condition, if the head section 150 is rotated about the rotary axis A, the floating distance of the electrical cable W from the wiring surface 25f becomes relatively great, and the electrical cable W is wired on the wiring surface 25f while the electrical cable W is being caught by an inner side projecting portion 26. Consequently, the floating distance of the electrical cable W is likely to become great. Otherwise, there is a possibility that the electrical cable W is not caught by the inner projecting portion 26 well and is disengaged from the inner projecting portion 26. In order to avoid this problem, for example, a pushing pin 170 is advanced along the rotary axis A while the head section 150 is stopped, and an operation of pressing the electrical cable W onto the wiring surface 25f must be carried out frequently.

According to the electrical cable wiring head device 40 and the electrical cable wiring apparatus constructed above, since the guide roller 73 that guides the electrical cable W supplied from the head section 50 is disposed along the rotary axis A of the head section 50, the guide roller 73 can guide the electrical cable W so that the electrical cable W approaches the wiring surface 25f as near as possible. Thus, for example, even when the head section 50 rotates in order to bend and wire the electrical cable W, it is possible for the roller portion 73 of a guide pushing member 70 to guide the electrical cable W and to effectively restrain the electrical cable W from floating from the wiring surface 25f. Consequently, even if the electrical cable W is bent and wired, the head section 50 is stopped, and the guide pushing member 70 or the auxiliary pushing member 80 is advanced to press the electrical cable W onto the wiring surface 25f. It is possible to reduce the number of effecting the above operation, thereby rapidly wiring the electrical cable W. However, since the electrical cable W is likely to float from the wiring surface 25f gradually if the electrical cable W is wired for a long distance, at least one of the guide pushing member 70 and the auxiliary pushing member 80 presses the electrical cable W onto the wiring surface 25f at a suitable timing.

In addition, since the electrical cable W can be guided at a position near the wiring surface 25f rather than the bottom surface of the head section 50 by the roller portion 73 in the retracted position, it is possible to surely prevent the electrical cable W from floating from the wiring surface 25f.

It was possible under a producing environment of the inventors to reduce a period in time of producing the wiring plate 24, on which the electrical cable W is wired, by 20% to 25% in comparison with the casing of using the head section 150 shown in FIG. 9.

It is also possible to press the electrical cable W onto the wiring surface 25f by the auxiliary pushing member 80 as well as the guide pushing member 70. In particular, there is an advantage that the auxiliary pushing member 80 can press the floating electrical wire W in a narrow space or the member 80 can press the electrical cable W at a position apart from the head section 50 by a certain distance.

What is claimed is:

1. An electrical cable wiring head device that is movable along a wiring surface of an object to be wired to connect an electrical cable to the wiring surface, comprising:
    a head section supported rotatably about a rotary axis of the head section that is substantially perpendicular to the wiring surface, the head section including a guide recess for guiding the electrical cable to the wiring surface, the guide recess being offset from the rotary axis;
    a head rotating mechanism for rotating the head section about the rotary axis;
    a guide pushing member including a shaft portion and a roller portion provided rotatably on a distal end of the shaft portion, the guide pushing member being supported movably along the rotary axis so that the roller portion is directed to the wiring surface; and
    a guide pushing member drive mechanism that reciprocates the guide pushing member so that the roller portion is moved between a first retracted position where the roller portion guides the electrical cable supplied from the head section and a first advanced position where the roller portion presses the electrical cable supplied from the head section onto the wiring surface.

2. The electrical cable wiring head device according to claim 1, wherein the first retracted position is a position where the roller portion protrudes from a bottom surface of the head section toward the wiring surface.

3. The electrical cable wiring head device according to claim 2, further comprising:
    an auxiliary pushing member having a bar-like shape and supported movably in a direction parallel to the rotary axis, the auxiliary pushing member being offset from the rotary axis so that the rotary axis is between the auxiliary pushing member and the guide recess; and
    an auxiliary pushing member drive mechanism that reciprocates an end of the auxiliary pushing member between a second advanced position where the electrical cable supplied from the head section is pressed onto the wiring surface and a second retracted position backed from the second advanced position.

4. An electrical cable wiring apparatus comprising:
    an electrical cable wiring head device according to claim 2;
    an object holding section for holding an object to be wired;
    a wiring drive mechanism for moving the electrical cable wiring head device along the wiring surface of the object to be wired.

5. The electrical cable wiring head device according to claim 1, further comprising:
    an auxiliary pushing member having a bar-like shape and supported movably in a direction parallel to the rotary axis, the auxiliary pushing member being offset from the rotary axis so that the rotary axis is between the auxiliary pushing member and the guide recess; and
    an auxiliary pushing member drive mechanism that reciprocates an end of the auxiliary pushing member between a second advanced position where the electrical cable supplied from the head section is pressed onto the wiring surface and a second retracted position backed from the second advanced position.

6. An electrical cable wiring apparatus comprising:
    an electrical cable wiring head device according to claim 5;
    an object holding section for holding an object to be wired;
    a wiring drive mechanism for moving the electrical cable wiring head device along the wiring surface of the object to be wired.

7. An electrical cable wiring apparatus comprising:
    an electrical cable wiring head device according to claim 1;
    an object holding section for holding an object to be wired;
    a wiring drive mechanism for moving the electrical cable wiring head device along the wiring surface of the object to be wired.

8. An electrical cable wiring head device that is movable along a wiring surface of an object to connect an electrical cable to the wiring surface, comprising:
    a head section supported rotatably about a rotary axis of the head section that is substantially perpendicular to the wiring surface, the head section including a guide recess for guiding the electrical cable along a path to the wiring surface, the guide recess being offset from the rotary axis;
    a head rotating mechanism for rotating the head section about the rotary axis;
    a guide pushing member including a shaft portion and a roller portion provided rotatably on a distal end of the shaft portion, the guide pushing member being supported movably along the rotary axis to direct the roller portion to the wiring surface; and
    a guide pushing member drive mechanism that reciprocates the guide pushing member so that the roller portion moves between a first retracted position where the roller portion guides the electrical cable supplied from the head section and a first advanced position where the roller portion presses the electrical cable supplied from the head section onto the wiring surface.

* * * * *